(12) United States Patent
Honke et al.

(10) Patent No.: US 11,862,684 B2
(45) Date of Patent: Jan. 2, 2024

(54) RECYCLE WAFER OF SILICON CARBIDE AND METHOD FOR MANUFACTURING SILICON CARBIDE SEMICONDUCTOR DEVICE

(71) Applicant: SUMITOMO ELECTRIC INDUSTRIES, LTD., Osaka (JP)

(72) Inventors: Tsubasa Honke, Osaka (JP); Kyoko Okita, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 265 days.

(21) Appl. No.: 17/420,416

(22) PCT Filed: Sep. 26, 2019

(86) PCT No.: PCT/JP2019/037837
§ 371 (c)(1),
(2) Date: Jul. 2, 2021

(87) PCT Pub. No.: WO2020/144900
PCT Pub. Date: Jul. 16, 2020

(65) Prior Publication Data
US 2022/0085172 A1   Mar. 17, 2022

(30) Foreign Application Priority Data
Jan. 8, 2019   (JP) .................................. 2019-001173

(51) Int. Cl.
*H01L 29/16* (2006.01)
*H01L 21/02* (2006.01)
(52) U.S. Cl.
CPC .... *H01L 29/1608* (2013.01); *H01L 21/02002* (2013.01); *H01L 21/02378* (2013.01)

(58) Field of Classification Search
CPC .......... H01L 29/1608; H01L 21/02002; H01L 21/02378; H01L 29/7802; H01L 21/02032; H01L 29/66068; C30B 25/20; C30B 29/36
See application file for complete search history.

(56) References Cited

U.S. PATENT DOCUMENTS 9,057,147 B2 * 6/2015 Genba ..................... C30B 25/08
2015/0017790 A1   1/2015 Yamamoto
(Continued)

FOREIGN PATENT DOCUMENTS

JP   2008-311542 A   12/2008
JP   2015-18960 A   1/2015
(Continued)

*Primary Examiner* — Cuong B Nguyen
(74) *Attorney, Agent, or Firm* — Renner, Otto, Boisselle & Sklar, LLP

(57) ABSTRACT

A recycle wafer of silicon carbide has a silicon carbide substrate and a first silicon carbide layer. The silicon carbide substrate has a first main surface and a second main surface opposite to the first main surface. The first silicon carbide layer is in contact with the first main surface. The silicon carbide substrate includes a substrate region that is within 10 μm from the first main surface toward the second main surface. In a direction perpendicular to the first main surface, a value obtained by subtracting a value that is three times a standard deviation of a nitrogen concentration in the substrate region from an average value of the nitrogen concentration in the substrate region is greater than a minimum value of a nitrogen concentration in the first silicon carbide layer.

6 Claims, 15 Drawing Sheets

(56) References Cited

U.S. PATENT DOCUMENTS

2018/0040480 A1    2/2018  Imai
2020/0144053 A1    5/2020  Hamano

FOREIGN PATENT DOCUMENTS

| | | |
|---|---|---|
| JP | 2016-052991 A | 4/2016 |
| JP | 2018-22853 A | 2/2018 |
| WO | 2009/151077 A1 | 12/2009 |
| WO | 2015/170500 A1 | 11/2015 |
| WO | 2018/096684 A1 | 5/2018 |

\* cited by examiner

RECYCLE WAFER OF SILICON CARBIDE AND METHOD FOR MANUFACTURING SILICON CARBIDE SEMICONDUCTOR DEVICE

TECHNICAL FIELD

The present disclosure relates to a recycle wafer of silicon carbide and a method for manufacturing a silicon carbide semiconductor device. The present application claims priority to Japanese Patent Application No. 2019-001173 filed on Jan. 8, 2019, the entire contents of which are incorporated herein by reference.

BACKGROUND ART

Japanese Patent Laying-Open No. 2016-52991 (PTL 1) describes a silicon carbide epitaxial substrate. The silicon carbide epitaxial substrate described in Japanese Patent Laying-Open No. 2016-52991 has a silicon carbide substrate and an epitaxial layer formed on one main surface of the silicon carbide substrate.

CITATION LIST

Patent Literature

PTL 1: Japanese Patent Laying-Open No. 2016-52991

SUMMARY OF INVENTION

A recycle wafer of silicon carbide in accordance with one aspect of the present disclosure includes a silicon carbide substrate and a first silicon carbide layer. The silicon carbide substrate has a first main surface and a second main surface opposite to the first main surface. The first silicon carbide layer is in contact with the first main surface. The silicon carbide substrate includes a substrate region that is within 10 μm from the first main surface toward the second main surface. In a direction perpendicular to the first main surface, a value obtained by subtracting a value that is three times a standard deviation of a nitrogen concentration in the substrate region from an average value of the nitrogen concentration in the substrate region is greater than a minimum value of a nitrogen concentration in the first silicon carbide layer.

DETAILED DESCRIPTION

Figure 1:
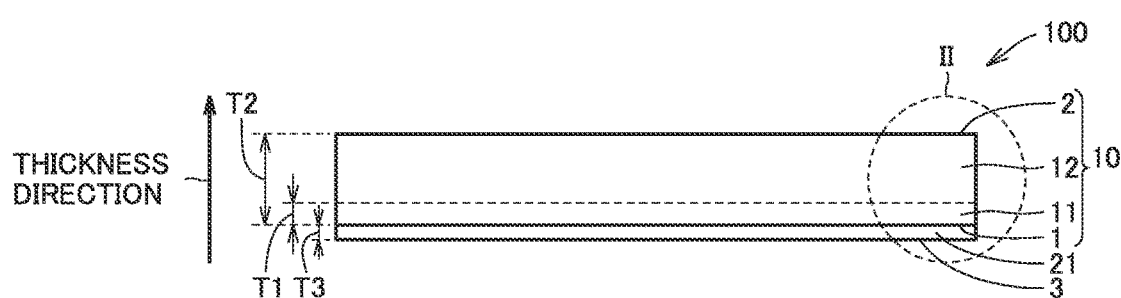
FIG. 1 is a schematic cross sectional view showing a configuration of a recycle wafer of silicon carbide in accordance with the present embodiment.

Problem to be Solved by the Present Disclosure

An object of the present disclosure is to provide a recycle wafer of silicon carbide and a method for manufacturing a silicon carbide semiconductor device that can reduce the absolute value of the amount of change in warpage before and after epitaxial growth.

Advantageous Effect of the Present Disclosure

According to the above description, a recycle wafer of silicon carbide and a method for manufacturing a silicon carbide semiconductor device that can reduce the absolute value of the amount of change in warpage before and after epitaxial growth can be provided.

Summary of Embodiment of the Present Disclosure

First, a summary of an embodiment of the present disclosure will be described. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral, but is indicated by putting the negative sign before the numeral in the present specification.

(1) A recycle wafer 100 of silicon carbide in accordance with one aspect of the present disclosure includes a silicon carbide substrate 10 and a first silicon carbide layer 21. Silicon carbide substrate 10 has a first main surface 1 and a second main surface 2 opposite to first main surface 1. First silicon carbide layer 21 is in contact with first main surface 1. Silicon carbide substrate 10 includes a substrate region 11 that is within 10 µm from first main surface 1 toward second main surface 2. In a direction perpendicular to first main surface 1, a value obtained by subtracting a value that is three times a standard deviation of a nitrogen concentration in substrate region 11 from an average value of the nitrogen concentration in substrate region 11 is greater than a minimum value of a nitrogen concentration in first silicon carbide layer 21.

(2) In recycle wafer 100 of silicon carbide in accordance with (1) described above, the minimum value may be greater than a value obtained by dividing the average value by 1000.

(3) In recycle wafer 100 of silicon carbide in accordance with (1) or (2) described above, silicon carbide substrate 10 may further have an outer peripheral surface 7, a first inclined surface 4, and a second inclined surface 6, first inclined surface 4 being continuous to each of first main surface 1 and outer peripheral surface 7 and being inclined toward second main surface 2 as first inclined surface 4 extends from first main surface 1 to outer peripheral surface 7, second inclined surface 6 being continuous to each of second main surface 2 and outer peripheral surface 7 and being inclined toward first main surface 1 as second inclined surface 6 extends from second main surface 2 to outer peripheral surface 7. First silicon carbide layer 21 may be in contact with first inclined surface 4. First silicon carbide layer 21 may have a third inclined surface 5 opposite to first inclined surface 4. A length of third inclined surface 5 in a direction parallel to first main surface 1 may be greater than a length of second inclined surface 6 in a direction parallel to second main surface 2. A length of third inclined surface 5 in the direction perpendicular to first main surface 1 may be greater than a length of second inclined surface 6 in a direction perpendicular to second main surface 2.

(4) Recycle wafer 100 of silicon carbide in accordance with any of (1) to (3) described above may further include a second silicon carbide layer 22 in contact with second main surface 2.

(5) In recycle wafer 100 of silicon carbide in accordance with (4) described above, a thickness of second silicon carbide layer 22 may be greater than a thickness of first silicon carbide layer 21.

(6) A method for manufacturing a silicon carbide semiconductor device in accordance with one aspect of the present disclosure includes preparing recycle wafer 100 of silicon carbide according to any of (1) to (5) described above, and processing recycle wafer 100 of silicon carbide.

Details of Embodiment of the Present Disclosure

Next, the details of the embodiment of the present disclosure will be described with reference to the drawings. It should be noted that, in the drawings below, identical or corresponding parts will be designated by identical reference numerals, and an overlapping description will not be repeated.

(Recycle Wafer of Silicon Carbide)

FIG. 1 is a schematic cross sectional view showing a configuration of a recycle wafer of silicon carbide in accordance with the present embodiment. As shown in FIG. 1, recycle wafer 100 of silicon carbide in accordance with the present embodiment has silicon carbide substrate 10 and first silicon carbide layer 21. Silicon carbide substrate 10 has first main surface 1 and second main surface 2. Second main surface 2 is a surface opposite to first main surface 1. Silicon carbide substrate 10 has a first substrate region 11 and a second substrate region 12. First substrate region 11 is a region that is within 10 µm from first main surface 1 toward second main surface 2. First substrate region 11 constitutes first main surface 1. The thickness of first substrate region 11 (a first thickness T1) is 10 µm. The thickness of silicon carbide substrate 10 (a second thickness T2) is not particularly limited, and is more than or equal to 350 µm and less than or equal to 500 µm, for example. Silicon carbide substrate 10 has a substantially disk shape. The diameter of silicon carbide substrate 10 is more than or equal to 150 mm, for example.

Silicon carbide substrate 10 is constituted by a silicon carbide single crystal, for example. The silicon carbide constituting silicon carbide substrate 10 has a polytype of 4H, for example. Second main surface 2 is, for example, a {0001} plane or a plane inclined at an off-angle of more than or equal to 2° and less than or equal to 6° relative to the {0001} plane. Specifically, second main surface 2 is a (0001) plane or a plane inclined at an off-angle of more than or equal to 2° and less than or equal to 6° relative to the (0001) plane, for example. Alternatively, second main surface 2 may be a (000-1) plane or a plane inclined at an off-angle of more than or equal to 2° and less than or equal to 6° relative to the (000-1) plane, for example. When first main surface 1 is inclined relative to the {0001} plane, the direction of inclination (off direction) of first main surface 1 is a <11-20> direction, for example.

First silicon carbide layer 21 is located on the first main surface 1 side of silicon carbide substrate 10. First silicon carbide layer 21 is in contact with first main surface 1. First silicon carbide layer 21 is in contact with first substrate region 11 at first main surface 1. First main surface 1 is a back surface. The back surface is a surface on which a back-surface electrode (for example, a drain electrode) of a vertical semiconductor device is to be formed. Second main surface 2 is a front surface. The front surface is a surface on which a front-surface electrode (for example, a source electrode) of the vertical semiconductor device is to be formed.

The thickness of first silicon carbide layer 21 (a third thickness T3) is not particularly limited, and is 3 µm, for example. Third thickness T3 may be more than or equal to 0.5 µm and less than or equal to 10 µm, for example. The thickness of first silicon carbide layer 21 (third thickness T3) is smaller than the thickness of silicon carbide substrate 10 (second thickness T2). First silicon carbide layer 21 is a layer formed by epitaxial growth, for example. The silicon carbide constituting first silicon carbide layer 21 has a polytype of 4H, for example. First silicon carbide layer 21 has a third main surface 3 opposite to first main surface 1. Third main surface 3 is a {0001} plane or a plane inclined at an off-angle of more than or equal to 2° and less than or equal to 6° relative to the {0001} plane, for example.

Figure 2:
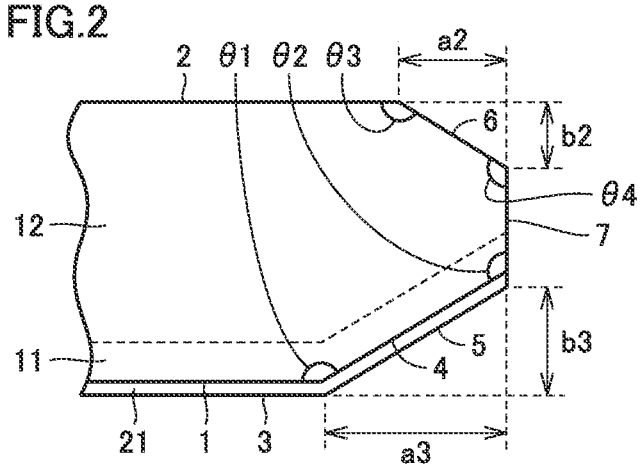
FIG. 2 is an enlarged schematic cross sectional view showing a configuration of a region II in FIG. 1.

FIG. 2 is an enlarged schematic cross sectional view showing a configuration of a region II in FIG. 1. As shown in FIG. 2, chamfering is performed on an outer peripheral portion of silicon carbide substrate 10. Specifically, silicon carbide substrate 10 has outer peripheral surface 7, first inclined surface 4, and second inclined surface 6. Outer peripheral surface 7 is an annular surface exposed to the outer periphery of silicon carbide substrate 10. First inclined surface 4 is continuous to each of first main surface 1 and outer peripheral surface 7. First inclined surface 4 is inclined toward second main surface 2 as first inclined surface 4 extends from first main surface 1 to outer peripheral surface 7. The angle formed between first inclined surface 4 and first main surface 1 (a first angle θ1) is more than 90° and less than 180°. The angle formed between first inclined surface 4 and outer peripheral surface 7 (a second angle θ2) is more than 90° and less than 180°. First inclined surface 4 is constituted by first substrate region 11.

As shown in FIG. 2, second inclined surface 6 is continuous to each of second main surface 2 and outer peripheral surface 7. Second inclined surface 6 is inclined toward first main surface 1 as second inclined surface 6 extends from second main surface 2 to outer peripheral surface 7. The angle formed between second inclined surface 6 and second main surface 2 (a third angle θ3) is more than 90° and less than 180°. The angle formed between second inclined surface 6 and outer peripheral surface 7 (a fourth angle θ4) is more than 90° and less than 180°. Second inclined surface 6 is constituted by second substrate region 12. First silicon carbide layer 21 is in contact with first inclined surface 4. First silicon carbide layer 21 has third inclined surface 5 opposite to first inclined surface 4. Third inclined surface 5 is substantially parallel to first inclined surface 4. Third inclined surface 5 is located on an outer peripheral side of third main surface 3. Third inclined surface 5 is continuous to third main surface 3.

The length of third inclined surface 5 in a direction parallel to first main surface 1 (a third horizontal length a3) may be greater than the length of second inclined surface 6 in a direction parallel to second main surface 2 (a second horizontal length a2). The length of third inclined surface 5 in a direction perpendicular to first main surface 1 (a third vertical length b3) may be greater than the length of second inclined surface 6 in a direction perpendicular to second main surface 2 (a second vertical length b2).

Figure 3:
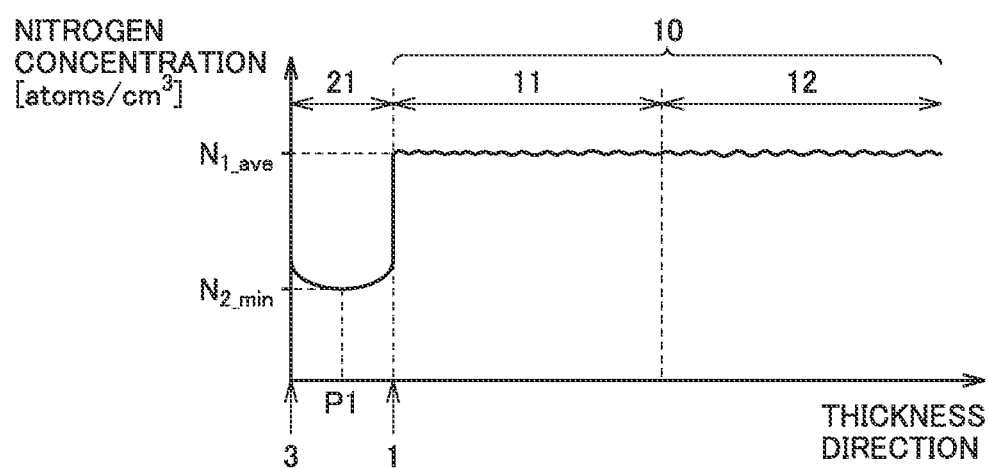
FIG. 3 is a schematic view showing a nitrogen concentration profile in the thickness direction of the recycle wafer of silicon carbide.

Each of silicon carbide substrate 10 and first silicon carbide layer 21 contains nitrogen (N) as an n type impurity. Each of silicon carbide substrate 10 and first silicon carbide layer 21 has an n type conductivity type. FIG. 3 is a schematic view showing a nitrogen concentration profile in the thickness direction of recycle wafer 100 of silicon carbide. The axis of abscissas in FIG. 3 represents the position in the thickness direction of recycle wafer 100 of silicon carbide. The axis of ordinates in FIG. 3 represents the nitrogen concentration in recycle wafer 100 of silicon carbide.

As shown in FIG. 3, the nitrogen concentration in silicon carbide substrate 10 exhibits a substantially constant value in the thickness direction. The average value of the nitrogen concentration in first substrate region 11 ($N_{1\_ave}$) of silicon carbide substrate 10 is more than or equal to $1\times10^{18}$ cm$^{-3}$ and less than or equal to $1\times10^{19}$ cm$^{-3}$, for example. First silicon carbide layer 21 has a region where the nitrogen concentration decreases from a boundary surface between first silicon carbide layer 21 and silicon carbide substrate 10 (first main surface 1) toward third main surface 3. The nitrogen concentration in first silicon carbide layer 21 exhibits a minimum value ($N_{2\_min}$) at a position P1 in first silicon carbide layer 21. Position P1 is located between third main surface 3 and first main surface 1 in the direction perpendicular to first main surface 1.

In the direction perpendicular to first main surface 1, the nitrogen concentration in first silicon carbide layer 21 may increase monotonically from position P1 to first main surface 1. From another viewpoint, first silicon carbide layer 21 may have a region where the nitrogen concentration increases monotonically from position P1 at which the nitrogen concentration exhibits the minimum value to first main surface 1. Similarly, in the direction perpendicular to first main surface 1, the nitrogen concentration in first silicon carbide layer 21 may increase monotonically from position P1 to third main surface 3. From another viewpoint, first silicon carbide layer 21 may have a region where the nitrogen concentration increases monotonically from position P1 at which the nitrogen concentration exhibits the minimum value to third main surface 3.

As shown in FIG. 3, the average value of the nitrogen concentration in first substrate region 11 ($N_{1\_ave}$) is greater than the minimum value of the nitrogen concentration in first silicon carbide layer 21 ($N_{2\_min}$). Specifically, in the direction perpendicular to first main surface 1, a value obtained by subtracting a value that is three times a standard deviation of the nitrogen concentration in first substrate region 11 from the average value of the nitrogen concentration in first substrate region 11 ($N_{1\_ave}$) is greater than the minimum value of the nitrogen concentration in first silicon carbide layer 21 ($N_{2\_min}$). The minimum value of the nitrogen concentration in first silicon carbide layer 21 ($N_{2\_min}$) may be greater than a value obtained by dividing the average value of the nitrogen concentration in first substrate region 11 ($N_{1\_ave}$) by 1000. The minimum value of the nitrogen concentration in first silicon carbide layer 21 ($N_{2\_min}$) may be greater than a value obtained by dividing the average value of the nitrogen concentration in first substrate region 11 ($N_{1\_ave}$) by 800, or may be greater than a value obtained by dividing the average value of the nitrogen concentration in first substrate region 11 ($N_{1\_ave}$) by 500. The minimum value of the nitrogen concentration in first silicon carbide layer 21 ($N_{2\_min}$) may be smaller than a value obtained by dividing the average value of the nitrogen concentration in first substrate region 11 ($N_{1\_ave}$) by 10.

Next, a method for measuring the nitrogen concentration will be described.

The nitrogen concentration in recycle wafer 100 of silicon carbide can be measured using secondary ion mass spectroscopy (SIMS). The measurement device is a secondary ion mass spectrometry device manufactured by Cameca, for example. The measuring pitch is 0.01 μm, for example. The primary ion beam is cesium (Cs). The primary ion energy is 14.5 eV. The secondary ion polarity is negative.

Next, a configuration of a variation of the recycle wafer of silicon carbide in accordance with the present embodiment will be described.

Figure 4:
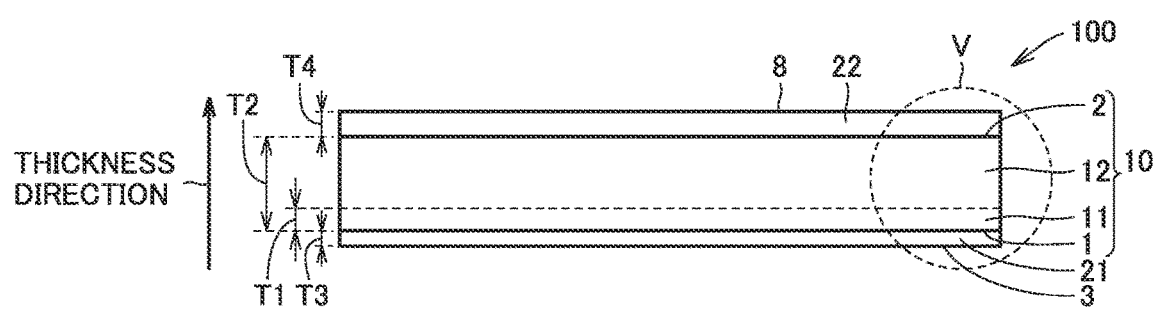
FIG. 4 is a schematic cross sectional view showing a configuration of a variation of the recycle wafer of silicon carbide in accordance with the present embodiment.

FIG. 4 is a schematic cross sectional view showing a configuration of a variation of the recycle wafer of silicon carbide in accordance with the present embodiment. As shown in FIG. 4, the variation of recycle wafer 100 of silicon carbide in accordance with the embodiment further has second silicon carbide layer 22, in addition to the configuration in FIG. 1. That is, recycle wafer 100 of silicon carbide may be constituted by silicon carbide substrate 10, first silicon carbide layer 21, and second silicon carbide layer 22. Second silicon carbide layer 22 is in contact with second main surface 2. From another viewpoint, second silicon carbide layer 22 is in contact with second substrate region 12 at second main surface 2. The thickness of second silicon carbide layer 22 (a fourth thickness T4) may be greater than the thickness of first silicon carbide layer 21 (third thickness T3). Fourth thickness T4 may be twice or more third thickness T3, for example. Fourth thickness T4 is more than or equal to 5 μm and less than or equal to 100 μm, for example.

Second silicon carbide layer 22 contains nitrogen (N) as an n type impurity. Second silicon carbide layer 22 has the n type conductivity type. The average value of the nitrogen concentration in second silicon carbide layer 22 may be smaller than the average value of the nitrogen concentration in first substrate region 11 ($N_{1\_ave}$) of silicon carbide substrate 10. The average value of the nitrogen concentration in second silicon carbide layer 22 may be greater than the minimum value of the nitrogen concentration in first silicon carbide layer 21 ($N_{2\_min}$).

Figure 5:
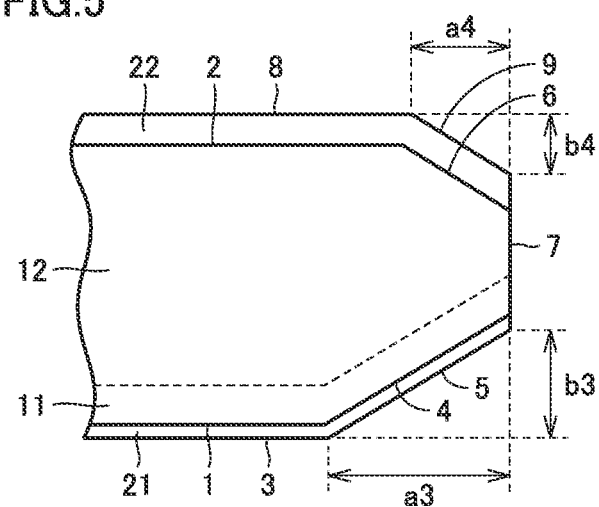
FIG. 5 is an enlarged schematic cross sectional view showing a configuration of a region V in FIG. 4.

FIG. 5 is an enlarged schematic cross sectional view showing a configuration of a region V in FIG. 4. As shown in FIG. 5, second silicon carbide layer 22 has a fourth main surface 8 and a fourth inclined surface 9. Fourth main surface 8 is opposite to second main surface 2. Fourth inclined surface 9 is opposite to second inclined surface 6. Fourth inclined surface 9 is located on an outer peripheral side of fourth main surface 8. Fourth inclined surface 9 is continuous to fourth main surface 8. Fourth inclined surface 9 is substantially parallel to second inclined surface 6. The length of third inclined surface 5 in the direction parallel to first main surface 1 (third horizontal length a3) may be greater than the length of fourth inclined surface 9 in the direction parallel to second main surface 2 (a fourth horizontal length a4). The length of third inclined surface 5 in the direction perpendicular to first main surface 1 (third vertical length b3) may be greater than the length of fourth inclined surface 9 in the direction perpendicular to second main surface 2 (a fourth vertical length b4).

(Method for Manufacturing Recycle Wafer of Silicon Carbide)

Next, a method for manufacturing the recycle wafer of silicon carbide in accordance with the present embodiment will be described.

Figure 6:
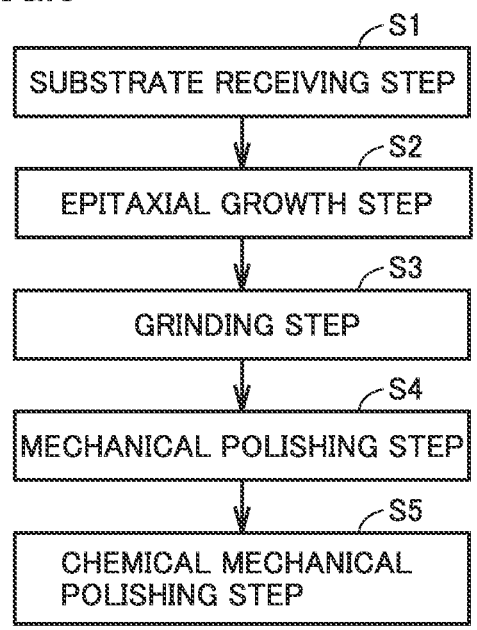
FIG. 6 is a process chart showing a method for manufacturing the recycle wafer of silicon carbide in accordance with the present embodiment.

FIG. 6 is a process chart showing a method for manufacturing the recycle wafer of silicon carbide in accordance with the present embodiment. As shown in FIG. 6, the method for manufacturing the recycle wafer of silicon carbide in accordance with the present embodiment mainly has a substrate receiving step (S1: FIG. 6), an epitaxial growth step (S2: FIG. 6), a grinding step (S3: FIG. 6), a mechanical polishing step (S4: FIG. 6), and a chemical mechanical polishing step (S5: FIG. 6).

Figure 7:
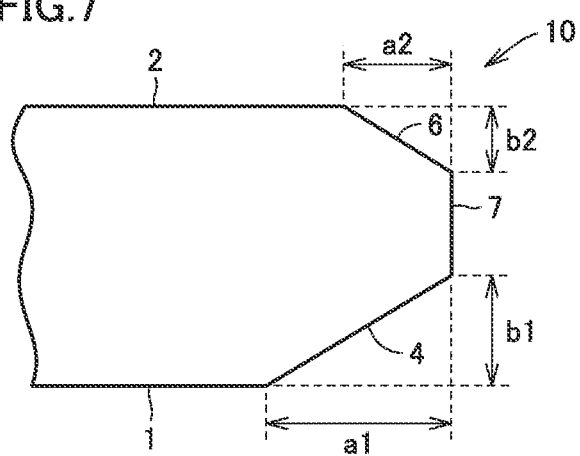
FIG. 7 is a schematic cross sectional view showing a substrate receiving step of the method for manufacturing the recycle wafer of silicon carbide in accordance with the present embodiment.

First, the substrate receiving step (S1: FIG. 6) is performed. In the substrate receiving step, silicon carbide substrate 10 is prepared. FIG. 7 is a schematic cross sectional view showing the substrate receiving step of the method for manufacturing recycle wafer 100 of silicon carbide in accordance with the present embodiment. Silicon carbide substrate 10 is formed of a silicon carbide single crystal. Silicon carbide substrate 10 is formed of a hexagonal silicon carbide single crystal having a polytype of 4H, for example. Silicon carbide substrate 10 has first main surface 1, first inclined surface 4, second main surface 2, second inclined surface 6, and outer peripheral surface 7. First inclined surface 4 is continuous to both of first main surface 1 and outer peripheral surface 7. First inclined surface 4 is inclined upward (toward second main surface 2) as first inclined surface 4 extends from first main surface 1 to outer peripheral surface 7.

As shown in FIG. 7, second main surface 2 is a surface opposite to first main surface 1. Second inclined surface 6 is continuous to both of second main surface 2 and outer peripheral surface 7. Second inclined surface 6 is inclined downward (toward first main surface 1) as second inclined surface 6 extends from second main surface 2 to outer peripheral surface 7. The length of first inclined surface 4 in the direction parallel to first main surface 1 (a first horizontal length a1) may be greater than the length of second inclined surface 6 in the direction parallel to second main surface 2 (second horizontal length a2). The length of first inclined surface 4 in the direction perpendicular to first main surface 1 (a first vertical length b1) may be greater than the length of second inclined surface 6 in the direction perpendicular to second main surface 2 (second vertical length b2).

Then, the epitaxial growth step (S2: FIG. 6) is performed. In the epitaxial growth step, a silicon carbide layer is formed by epitaxial growth, using a CVD (Chemical Vapor Deposition) method, for example. A mixed gas containing silane, propane, nitrogen, and hydrogen, for example, is introduced into a chamber of a CVD apparatus. On that occasion, the temperature within the chamber is maintained at about 1630° C., for example. Ammonia gas may be used instead of nitrogen gas.

Although the epitaxial growth is mainly performed on the front surface side, the mixed gas also reaches the back surface side of silicon carbide substrate 10. In particular, when silicon carbide substrate 10 is warped, a gap is formed between the back surface of silicon carbide substrate 10 and a susceptor, and thus the mixed gas enters the back surface side. In addition, also when first horizontal length a1 and first vertical length b1 of first inclined surface 4 are long, the mixed gas is likely to enter the back surface side of silicon carbide substrate 10. In such a case, deposition or sublimation of silicon carbide occurs not only on the front surface side but also on the back surface side of silicon carbide substrate 10.

Figure 8:
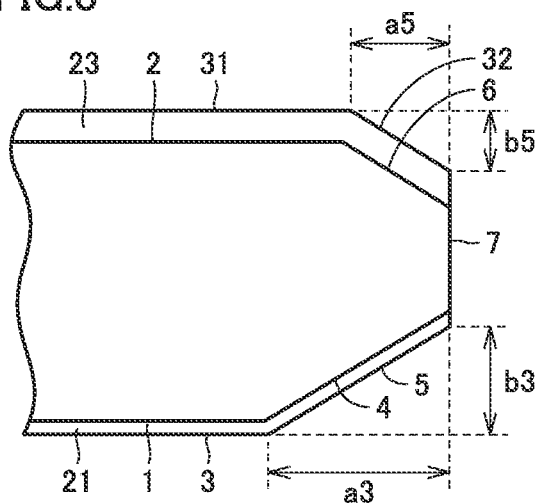
FIG. 8 is a schematic cross sectional view showing a state after an epitaxial growth step of the method for manufacturing the recycle wafer of silicon carbide in accordance with the present embodiment.

FIG. 8 is a schematic cross sectional view showing a state after the epitaxial growth step of the method for manufacturing the recycle wafer of silicon carbide in accordance with the present embodiment. As shown in FIG. 8, in the epitaxial growth step, a third silicon carbide layer 23 is formed on the front surface (second main surface 2 and second inclined surface 6) of silicon carbide substrate 10. The thickness of third silicon carbide layer 23 is 10 μm, for example. At the same time, first silicon carbide layer 21 is formed on the back surface (first main surface 1 and first inclined surface 4) of silicon carbide substrate 10. The thickness of first silicon carbide layer 21 is 3 μm, for example.

As shown in FIG. 8, third silicon carbide layer 23 has a fifth main surface 31 and a fifth inclined surface 32. Fifth main surface 31 is opposite to second main surface 2. Fifth inclined surface 32 is opposite to second inclined surface 6. Fifth inclined surface 32 is located on an outer peripheral side of fifth main surface 31. Fifth inclined surface 32 is continuous to fifth main surface 31. Fifth inclined surface 32 is substantially parallel to second inclined surface 6. The length of third inclined surface 5 in the direction parallel to first main surface 1 (third horizontal length a3) may be greater than the length of fifth inclined surface 32 in the direction parallel to second main surface 2 (a fifth horizontal length a5). The length of third inclined surface 5 in the direction perpendicular to first main surface 1 (third vertical length b3) may be greater than the length of fifth inclined surface 32 in the direction perpendicular to second main surface 2 (a fifth vertical length b5).

Then, evaluation of third silicon carbide layer 23 is performed. Specifically, it is determined whether third silicon carbide layer 23 has a failure. More specifically, it is determined whether the impurity concentration and the defect density in third silicon carbide layer 23 satisfy predetermined criteria. When it is determined that third silicon carbide layer 23 has a failure, third silicon carbide layer 23 is removed. In the following, a method for removing third silicon carbide layer 23 will be described.

First, the grinding step (S3. FIG. 6) is performed. In the grinding step, grinding is performed on the fifth main surface 31 side. The grinding device is DAG-810 manufactured by DISCO, for example. The grindstone is a diamond grindstone, for example. The grindstone has a mesh size of #2000. The number of revolutions of a spindle is 4000 rpm, for example. The number of revolutions of a table is 50 rpm, for example. The feed rate is 0.2 μm/second, for example. Thus, at least a portion of third silicon carbide layer 23 is removed by the grinding.

Then, the mechanical polishing step (S4: FIG. 6) is performed. In the mechanical polishing step, mechanical polishing is performed on the second main surface 2 side of silicon carbide substrate 10. Specifically, silicon carbide substrate 10 is held by a polishing head such that second main surface 2 of silicon carbide substrate 10 faces a surface plate. The mechanical polishing device is LGP-612 manufactured by Lapmaster, for example. A slurry containing abrasive grains is supplied between the surface plate and second main surface 2. The abrasive grains are diamond abrasive grains, for example. The abrasive grains have a grain size of 1 μm, for example. The number of revolutions of the surface plate is 60 rpm, for example. Thereby, third silicon carbide layer 23 is removed from silicon carbide substrate 10.

Figure 9:
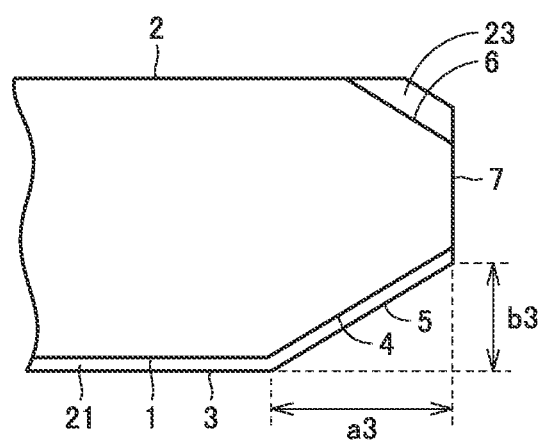
FIG. 9 is a schematic cross sectional view showing a state after a mechanical polishing step of the method for manufacturing the recycle wafer of silicon carbide in accordance with the present embodiment.

FIG. 9 is a schematic cross sectional view showing a state after the mechanical polishing step of the method for manufacturing the recycle wafer of silicon carbide in accordance with the present embodiment. As shown in FIG. 9, third silicon carbide layer 23 on second main surface 2 has been removed, and second main surface 2 is exposed. A portion of third silicon carbide layer 23 may be left on second inclined surface 6. First silicon carbide layer 21 is maintained in contact with each of first main surface 1 and first inclined surface 4.

Then, the chemical mechanical polishing step (S5. FIG. 6) is performed. In the chemical mechanical polishing step, chemical mechanical polishing is performed on the second main surface 2 side of silicon carbide substrate 10. Specifically, silicon carbide substrate 10 is held by the polishing head such that second main surface 2 faces a polishing cloth. A slurry is supplied between the polishing cloth and second main surface 2. The slurry is a colloidal silica slurry, for example. The slurry is DSC-0902 manufactured by Fujimi Incorporated, for example. The polishing cloth is made of suede, for example. The number of revolutions of the surface plate is 60 rpm, for example. In the chemical mechanical polishing step, the portion of third silicon carbide layer 23 left on second inclined surface 6 is removed. Thereby, recycle wafer 100 of silicon carbide in accordance with the present embodiment is manufactured (see FIG. 1).

It should be noted that, in the grinding step (S3: FIG. 6), the mechanical polishing step (S4: FIG. 6), and the chemical mechanical polishing step (S5: FIG. 6) described above, only one side (the second main surface 2 side) of silicon carbide substrate 10 is processed. Thereby, third silicon carbide layer 23 is removed. That is, in the grinding step (S3: FIG. 6), the mechanical polishing step (S4: FIG. 6), and the chemical mechanical polishing step (S5: FIG. 6) described above, processing is not performed on third main surface 3. Accordingly, first silicon carbide layer 21 is left without being removed.

(Method for Manufacturing Silicon Carbide Semiconductor Device)

Next, a method for manufacturing a silicon carbide semiconductor device 300 in accordance with the present embodiment will be described.

Figure 10:
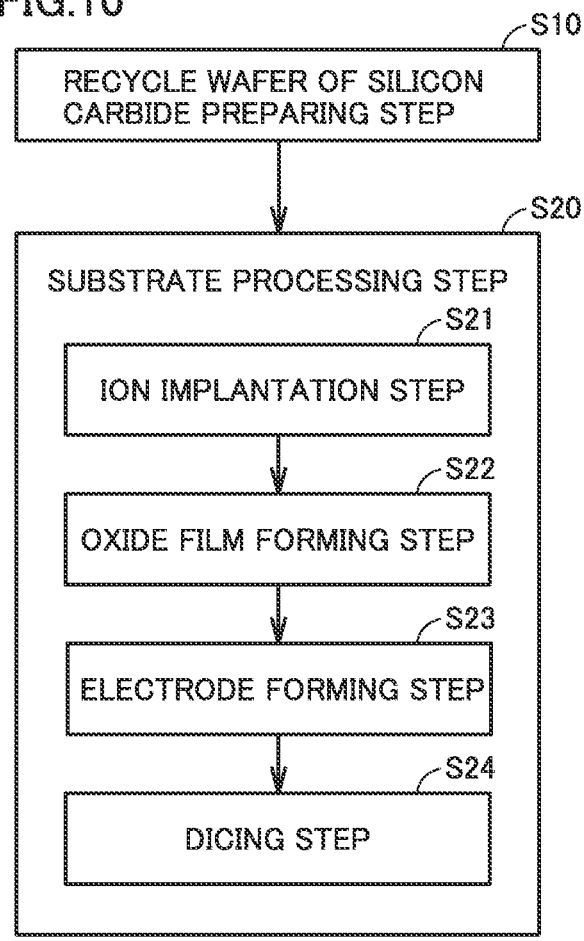
FIG. 10 is a process chart showing a method for manufacturing a silicon carbide semiconductor device in accordance with the present embodiment.

The method for manufacturing the silicon carbide semiconductor device in accordance with the present embodiment mainly has a recycle wafer 100 of silicon carbide preparing step (S10: FIG. 10) and a substrate processing step (S20: FIG. 10).

Figure 11:
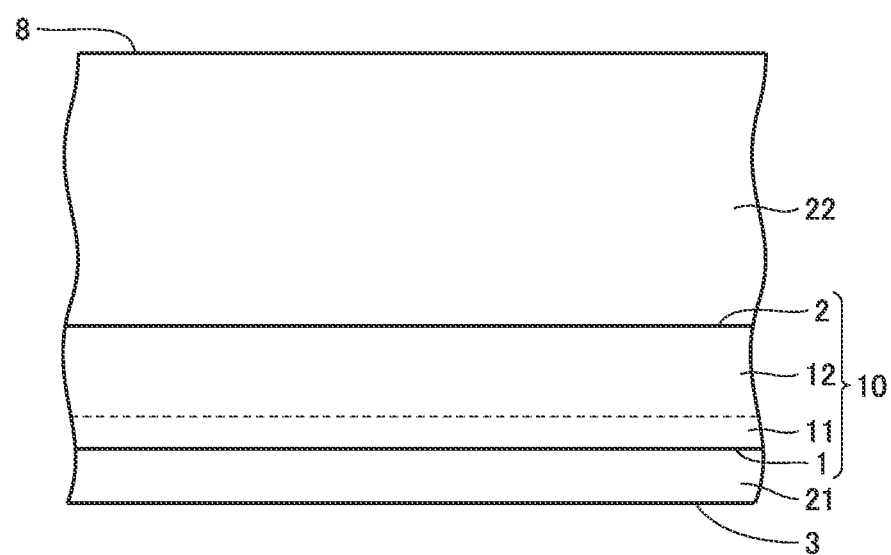
FIG. 11 is a schematic cross sectional view showing a first step of the method for manufacturing the silicon carbide semiconductor device in accordance with the present embodiment.

First, the recycle wafer of silicon carbide preparing step (S10: FIG. 10) is performed. Specifically, recycle wafer 100 of silicon carbide shown in FIG. 1 is prepared using the method for manufacturing recycle wafer 100 of silicon carbide described above. Then, epitaxial growth is performed on recycle wafer 100 of silicon carbide. Specifically, second silicon carbide layer 22 is formed by epitaxial growth, using the CVD (Chemical Vapor Deposition) method. The epitaxial growth conditions for second silicon carbide layer 22 may be the same as the epitaxial growth conditions for third silicon carbide layer 23 described above. Thus, recycle wafer 100 of silicon carbide having first silicon carbide layer 21, second silicon carbide layer 22, and silicon carbide substrate 10 is prepared (see FIG. 11).

Then, the substrate processing step (S20: FIG. 10) is performed. Specifically, the silicon carbide semiconductor device is manufactured by processing recycle wafer 100 of silicon carbide. The "processing" includes various types of processing such as ion implantation, heat treatment, etching, oxide film formation, electrode formation, and dicing, for example. That is, the substrate processing step may include at least one processing of ion implantation, heat treatment, etching, oxide film formation, electrode formation, and dicing.

In the following, a method for manufacturing a MOSFET (Metal Oxide Semiconductor Field Effect Transistor) as an example of the silicon carbide semiconductor device will be described. The substrate processing step (S20: FIG. 10) includes an ion implantation step (S21: FIG. 10), an oxide film forming step (S22: FIG. 10), an electrode forming step (S23: FIG. 10), and a dicing step (S24: FIG. 10), for example.

Figure 12:
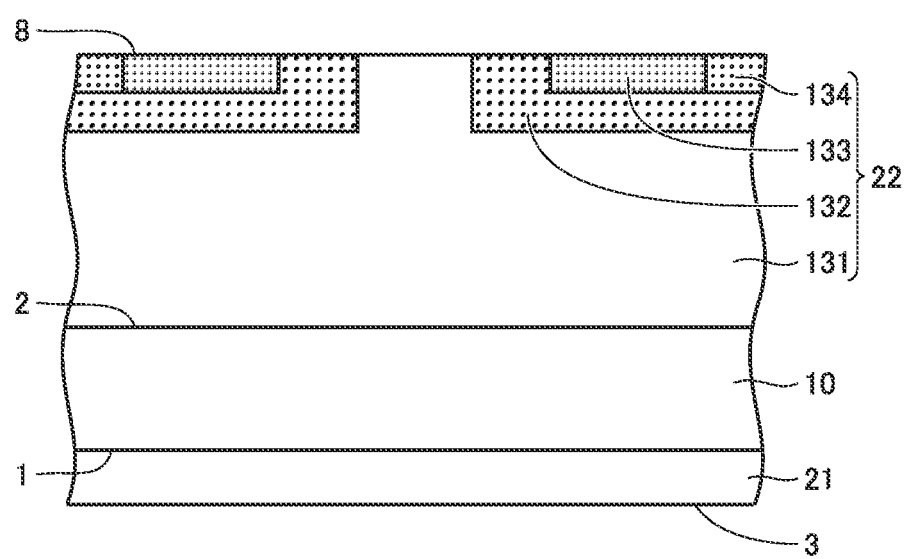
FIG. 12 is a schematic cross sectional view showing a second step of the method for manufacturing the silicon carbide semiconductor device in accordance with the present embodiment.

First, the ion implantation step (S21: FIG. 10) is performed. A p type impurity such as aluminum (Al), for example, is implanted into fourth main surface 8 on which a mask (not shown) having openings is formed. Thereby, a body region 132 having a p type conductivity type is formed. Then, an n type impurity such as phosphorus (P), for example, is implanted into a predetermined position within body region 132. Thereby, a source region 133 having the n type conductivity type is formed. Then, a p type impurity such as aluminum is implanted into a predetermined position within source region 133. Thereby, a contact region 134 having the p type conductivity type is formed (see FIG. 12).

In second silicon carbide layer 22, the portion other than body region 132, source region 133, and contact region 134 serves as a drift region 131. Source region 133 is separated from drift region 131 by body region 132. Ion implantation may be performed with recycle wafer 100 of silicon carbide being heated to about 300° C. or more and 600° C. or less. After the ion implantation, activation annealing is performed on recycle wafer 100 of silicon carbide. By the activation annealing, the impurities implanted into second silicon carbide layer 22 are activated, and carriers are generated in each region. The atmosphere for the activation annealing is an argon (Ar) atmosphere, for example. The temperature for the activation annealing is about 1800° C., for example. The time for the activation annealing is about 30 minutes, for example.

Figure 13:
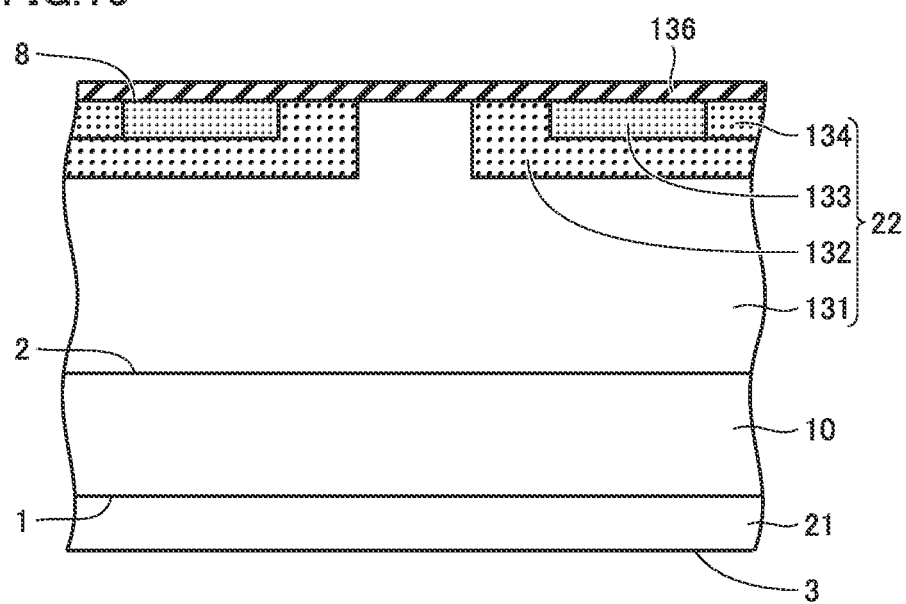
FIG. 13 is a schematic cross sectional view showing a third step of the method for manufacturing the silicon carbide semiconductor device in accordance with the present embodiment.

Then, the oxide film forming step (S22: FIG. 10) is performed. By heating recycle wafer 100 of silicon carbide in an atmosphere containing oxygen, for example, an oxide film 136 is formed on fourth main surface 8 (see FIG. 13). Oxide film 136 is composed of silicon dioxide or the like, for example. Oxide film 136 functions as a gate insulating film. The temperature for thermal oxidation treatment is about 1300° C., for example. The time for the thermal oxidation treatment is about 30 minutes, for example.

After oxide film 136 is formed, heat treatment may further be performed in a nitrogen atmosphere. For example, the heat treatment is performed in an atmosphere of nitric oxide, at about 1100° C., for about one hour. Thereafter, heat treatment is further performed in an argon atmosphere. For example, the heat treatment is performed in the argon atmosphere, at about 1100° C. or more and 1500° C. or less, for about one hour.

Then, the electrode forming step (S23: FIG. 10) is performed. Specifically, a gate electrode 141 is formed on oxide film 136. Gate electrode 141 is formed by the CVD (Chemical Vapor Deposition) method, for example. Gate electrode 141 is composed of polysilicon or the like having electrical conductivity, for example. Gate electrode 141 is formed at a position facing source region 133 and body region 132.

Subsequently, an interlayer insulating film 137 covering gate electrode 141 is formed. Interlayer insulating film 137 is formed by the CVD method, for example. Interlayer insulating film 137 is composed of silicon dioxide or the like, for example. Interlayer insulating film 137 is formed to come into contact with gate electrode 141 and oxide film 136. Then, portions of oxide film 136 and interlayer insulating film 137 are removed by etching. Thereby, source region 133 and contact region 134 are exposed from oxide film 136.

Figure 14:
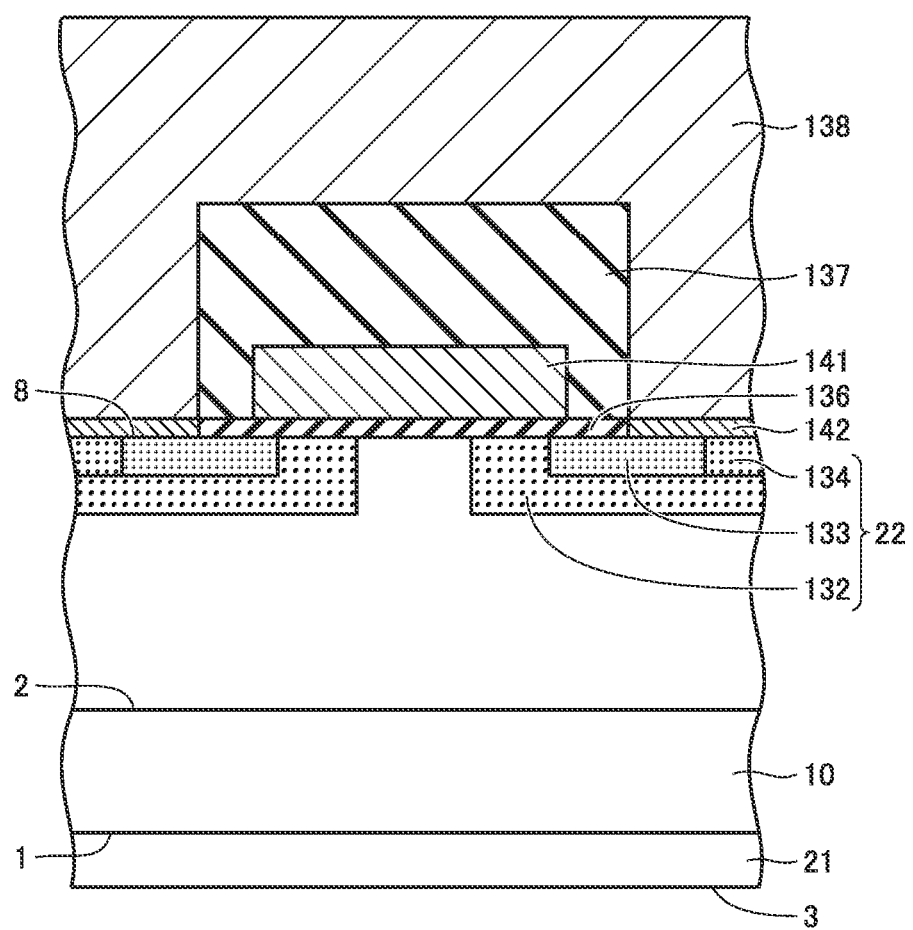
FIG. 14 is a schematic cross sectional view showing a fourth step of the method for manufacturing the silicon carbide semiconductor device in accordance with the present embodiment.

Subsequently, a source electrode 142 is formed at the exposed portion by a sputtering method, for example. Source electrode 142 is composed of titanium, aluminum, silicon, or the like, for example. After source electrode 142 is formed, source electrode 142 and recycle wafer 100 of silicon carbide are heated at a temperature of about 900° C. or more and 1100° C. or less, for example. Thereby, source electrode 142 and recycle wafer 100 of silicon carbide come into ohmic contact with each other. Then, an interconnection layer 138 is formed to come into contact with source electrode 142 (see FIG. 14). Interconnection layer 138 is composed of a material containing aluminum, for example.

Subsequently, a back surface polishing step is performed. In the back surface polishing step, first silicon carbide layer 21 is removed. After first silicon carbide layer 21 is removed, a portion of silicon carbide substrate 10 is further removed. Thereby, the thickness of silicon carbide substrate 10 is reduced. Then, a drain electrode 143 is formed on first main surface 1 of silicon carbide substrate 10. Drain electrode 143 is composed of an alloy containing nickel and silicon (for example, NiSi or the like), for example. Drain electrode 143 is formed to come into contact with silicon carbide substrate 10 at first main surface 1.

Figure 15:
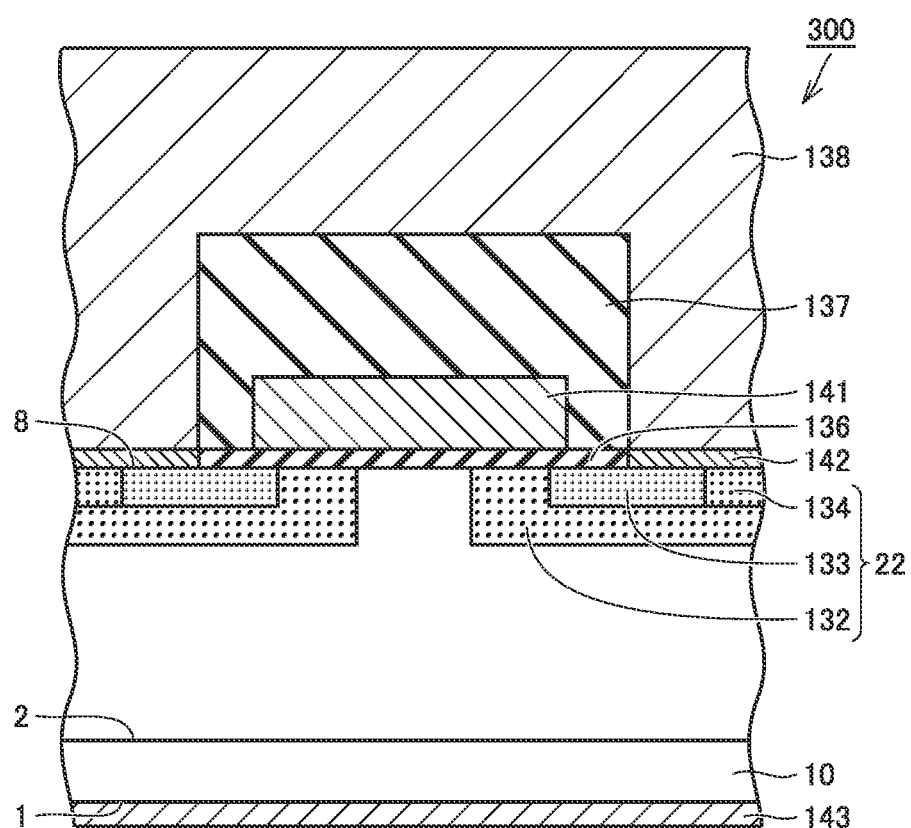
FIG. 15 is a schematic cross sectional view showing a fifth step of the method for manufacturing the silicon carbide semiconductor device in accordance with the present embodiment.

Then, the dicing step (S24: FIG. 10) is performed. For example, recycle wafer 100 of silicon carbide is divided into a plurality of semiconductor chips by being diced along dicing lines. Thus, silicon carbide semiconductor device 300 is manufactured (see FIG. 15).

It should be noted that, although the method for manufacturing the silicon carbide semiconductor device in accordance with the present disclosure has been described above by taking a planar MOSFET as an example, the manufacturing method in accordance with the present disclosure is not limited thereto. The manufacturing method in accordance with the present disclosure is applicable to silicon carbide semiconductor devices such as a trench MOSFET, an IGBT (Insulated Gate Bipolar Transistor), an SBD (Schottky Barrier Diode), a thyristor, a GTO (Gate Turn Off thyristor), a PN diode, and the like, for example.

Next, the function and effect of the recycle wafer of silicon carbide and the method for manufacturing the silicon carbide semiconductor device in accordance with the present embodiment will be described.

Recycle wafer 100 of silicon carbide in accordance with the present embodiment has silicon carbide substrate 10 and first silicon carbide layer 21. Silicon carbide substrate 10 has first main surface 1 and second main surface 2 opposite to first main surface 1. First silicon carbide layer 21 is in contact with first main surface 1. In the case where first silicon carbide layer 21 is provided on the first main surface 1 side, when second silicon carbide layer 22 is formed on second main surface 2 by epitaxial growth, silicon carbide substrate 10 is sandwiched between first silicon carbide layer 21 and second silicon carbide layer 22. Accordingly, in the thickness direction of silicon carbide substrate 10, a stress acts in a direction in which it is balanced. This results in a reduction of the absolute value of the amount of change in warpage before and after second silicon carbide layer 22 is formed on second main surface 2 by epitaxial growth.

In addition, recycle wafer 100 of silicon carbide in accordance with the present embodiment is manufactured by performing grinding and mechanical polishing on second main surface 2 with first silicon carbide layer 21 being in contact with first main surface 1 of silicon carbide substrate 10. Since first main surface 1 is protected by first silicon carbide layer 21, it is possible to suppress damage to first main surface 1 of silicon carbide substrate 10.

Further, according to the method for manufacturing silicon carbide semiconductor device 300 in accordance with the present embodiment, the transfer failure rate of recycle wafers 100 of silicon carbide in a transfer step can be reduced. Furthermore, according to the method for manufacturing the silicon carbide semiconductor device in accordance with the present embodiment, the suction failure rate of recycle wafers 100 of silicon carbide of wafers in an exposure step can be reduced.

First Example (Preparation of Samples)

First, recycle wafers 100 of silicon carbide in accordance with samples 1 and 2 were prepared. Recycle wafer 100 of silicon carbide in accordance with sample 1 served as an example. Recycle wafer 100 of silicon carbide in accordance with sample 2 served as a comparative example. Recycle wafer 100 of silicon carbide in accordance with sample 1 had silicon carbide substrate 10 and first silicon carbide layer 21. Recycle wafer 100 of silicon carbide in accordance with sample 2 had silicon carbide substrate 10 but did not have first silicon carbide layer 21.

Recycle wafers 100 of silicon carbide in accordance with samples 1 and 2 were manufactured according to the method for manufacturing recycle wafer 100 of silicon carbide described above, except for the following point. Specifically, recycle wafer 100 of silicon carbide in accordance with sample 1 was manufactured by processing only one side (the second main surface 2 side) in the grinding step (S3: FIG. 6), the mechanical polishing step (S4: FIG. 6), and the chemical mechanical polishing step (S5: FIG. 6) described above. Accordingly, first silicon carbide layer 21 was left without being removed. On the other hand, recycle wafer 100 of silicon carbide in accordance with sample 2 was manufactured by processing both sides (the first main surface 1 side and the second main surface 2 side) in the grinding step (S3: FIG. 6), the mechanical polishing step (S4. FIG. 6), and the chemical mechanical polishing step (S5: FIG. 6) described above. Accordingly, first silicon carbide layer 21 was removed.

Then, the nitrogen concentration in each recycle wafer 100 of silicon carbide was measured using secondary ion mass spectroscopy (SIMS). The measurement device was a secondary ion mass spectrometry device manufactured by Cameca. The measuring pitch was 0.01 μm. The nitrogen concentration was measured by penetrating recycle wafer 100 of silicon carbide from the back surface side toward the front surface side of recycle wafer 100 of silicon carbide. In recycle wafer 100 of silicon carbide in accordance with sample 1, a region 3 μm from the back surface was the region of first silicon carbide layer 21. In recycle wafer 100 of silicon carbide in accordance with sample 2, a region 3 μm from the back surface was the region of silicon carbide substrate 10. A minimum value of the nitrogen concentration in the region 3 μm from the back surface was defined as $N_{2\_min}$.

In recycle wafer 100 of silicon carbide in accordance with sample 1, a position 3 μm away from the back surface toward the front surface is a boundary between first silicon carbide layer 21 and silicon carbide substrate 10. In recycle wafer 100 of silicon carbide in accordance with sample 2, a position 3 μm away from the back surface toward the front surface is the region of silicon carbide substrate 10. The average value and the standard deviation of the nitrogen concentration in a region from the position 3 μm away from the back surface toward the front surface to a position 13 μm away from the back surface toward the front surface were defined as $N_{1\_ave}$ and $\sigma(N_1)$, respectively.

As shown in Table 1, $N_{1\_ave}$, $\sigma(N_1)$ and $N_{2\_min}$ of recycle wafer 100 of silicon carbide in accordance with sample 1 were $6.81 \times 10^{18}$ cm$^{-3}$, $7.74 \times 10^{16}$ cm$^{-3}$, and $2.31 \times 10^{16}$ cm$^{-3}$, respectively. $N_{1\_ave}$, $\sigma(N_1)$, and $N_{2\_min}$ of recycle wafer 100 of silicon carbide in accordance with sample 2 were $3.53 \times 10^{18}$ cm$^{-3}$, $8.46 \times 10^{16}$ cm$^{-3}$, and $3.36 \times 10^{18}$ cm$^{-3}$, respectively.

TABLE 1

| Sample No. | Sample 1 | Sample 2 |
|---|---|---|
| First Silicon Carbide Layer | Present | Absent |
| $N_{1\_ave}$ (cm$^{-3}$) | $6.81 \times 10^{18}$ | $3.53 \times 10^{18}$ |
| $\sigma(N_1)$ (cm$^{-3}$) | $7.74 \times 10^{16}$ | $8.46 \times 10^{16}$ |
| $N_{2\_min}$ (cm$^{-3}$) | $2.31 \times 10^{16}$ | $3.36 \times 10^{18}$ |
| $N_{1\_ave}$-3 × $\sigma(N_1)$ (cm$^{-3}$) | $6.58 \times 10^{18}$ | $3.28 \times 10^{18}$ |
| WARP before Epitaxial Growth (μm) | 41.6 | 22.2 |
| WARP after Epitaxial Growth (μm) | 32.7 | 59.1 |
| Amount of Change in WARP (μm) | −8.9 | +36.9 |

(Evaluation Method)

Next, warpage was measured before and after second silicon carbide layer 22 was formed on second main surface 2 of recycle wafer 100 of silicon carbide. First, warpage of recycle wafer 100 of silicon carbide before forming second silicon carbide layer 22 on second main surface 2 of recycle wafer 100 of silicon carbide was measured. Specifically, a WARP of recycle wafer 100 of silicon carbide before forming second silicon carbide layer 22 was measured. Subsequently, second silicon carbide layer 22 was formed on second main surface 2 of recycle wafer 100 of silicon carbide in accordance with each of samples 1 and 2 by epitaxial growth. Specifically, first, recycle wafer 100 of silicon carbide in accordance with each of samples 1 and 2 was placed within a chamber of a CVD apparatus, with second main surface 2 being exposed. Subsequently, a mixed gas containing silane, propane, nitrogen, and hydrogen was introduced into the chamber. On that occasion, the temperature within the chamber was maintained at about 1630° C. The thickness of second silicon carbide layer 22 was 10 μm. Subsequently, a WARP of recycle wafer 100 of silicon carbide after forming second silicon carbide layer 22 was measured.

It should be noted that a WARP is one of the indicators of the magnitude of warpage, and is a value calculated as the sum of the distance from a three-point reference plane to the largest displacement value on one side with respect to the three-point reference plane and the distance from the three-point reference plane to the largest displacement value on the other side with respect to the three-point reference plane. The three-point reference plane is a plane passing through three measurement points inside a measurement region. The three measurement points are positions located inside by 3% of the diameter of the measurement region and located at 0°, 120°, and 240°. The measurement of the WARP was performed with Flatmaster manufactured by Tropel.

(Evaluation Result)

As shown in Table 1, the WARPs before and after forming second silicon carbide layer 22 on second main surface 2 of recycle wafer 100 of silicon carbide in accordance with sample 1 were 41.6 μm and 32.7 μm, respectively. The amount of change in WARP was −8.9 μm. On the other hand, the WARPs before and after forming second silicon carbide layer 22 on second main surface 2 of recycle wafer 100 of silicon carbide in accordance with sample 2 were 22.2 μm and 59.1 μm, respectively. The amount of change in WARP was +36.9 μm. According to the above results, it was confirmed that recycle wafer 100 of silicon carbide in accordance with sample 1 can reduce the absolute value of the amount of change in warpage before and after epitaxial growth, when compared with recycle wafer 100 of silicon carbide in accordance with sample 2.

Second Example (Preparation of Samples)

First, recycle wafers 100 of silicon carbide in accordance with samples 1 and 2 were prepared. Recycle wafers 100 of silicon carbide in accordance with samples 1 and 2 were the same as those described in the first example. Then, second silicon carbide layer 22 was formed on second main surface 2 of each recycle wafer 100 of silicon carbide.

(Evaluation Method)

The influence of first silicon carbide layer 21 during transfer of recycle wafer 100 of silicon carbide having second silicon carbide layer 22 formed on second main surface 2 was evaluated. Specifically, the transfer failure rate during manufacture of silicon carbide semiconductor devices was evaluated. The case where recycle wafer 100 of silicon carbide fell within a facility, and the case where recycle wafer 100 of silicon carbide was unable to be recognized, during transfer of recycle wafer 100 of silicon carbide, were regarded as transfer failures. A value obtained by dividing the number of recycle wafers 100 of silicon carbide having transfer failures by the number of all recycle wafers 100 of silicon carbide attempted to be transferred was defined as the transfer failure rate.

In addition, the influence of first silicon carbide layer 21 during suction of recycle wafer 100 of silicon carbide having second silicon carbide layer 22 formed on second main surface 2 onto a chuck in an exposure step was evaluated.

Specifically, the suction failure rate during manufacture of silicon carbide semiconductor devices was evaluated. The case where a suction pressure was less than a predetermined value during suction of recycle wafer 100 of silicon carbide was regarded as a suction failure. A value obtained by dividing the number of recycle wafers 100 of silicon carbide having suction failures by the number of all recycle wafers 100 of silicon carbide attempted to be suctioned was defined as the suction failure rate.

(Evaluation Result)

TABLE 2

| Sample No. | Sample 1 | Sample 2 |
|---|---|---|
| First Silicon Carbide Layer | Present | Absent |
| $N_{1\_ave}$ (cm$^{-3}$) | $6.81 \times 10^{18}$ | $3.53 \times 10^{18}$ |
| $\sigma(N_1)$ (cm$^{-3}$) | $7.74 \times 10^{16}$ | $8.46 \times 10^{16}$ |
| $N_{2\_mm}$ (cm$^{-3}$) | $2.31 \times 10^{16}$ | $3.36 \times 10^{16}$ |
| $N_{1\_ave}$-3 × $\sigma(N_1)$ (cm$^{-3}$) | $6.58 \times 10^{18}$ | $3.28 \times 10^{18}$ |
| Transfer Failure Rate (%) | 0 | 24 |
| Suction Failure Rate (%) | 2 | 13 |

As shown in Table 2, the transfer failure rates of recycle wafers 100 of silicon carbide in accordance with samples 1 and 2 were 0% and 24%, respectively. In addition, the suction failure rates of recycle wafers 100 of silicon carbide in accordance with samples 1 and 2 were 2% and 13%, respectively. According to the above results, it was confirmed that recycle wafer 100 of silicon carbide in accordance with sample 1 can reduce the transfer failure rate and the suction failure rate, when compared with recycle wafer 100 of silicon carbide in accordance with sample 2.

It should be understood that the embodiment and the examples disclosed herein are illustrative and non-restrictive in every respect. The scope of the present invention is defined by the scope of the claims, rather than the above description, and is intended to include any modifications within the scope and meaning equivalent to the scope of the claims.

REFERENCE SIGNS LIST

1: first main surface; 2: second main surface; 3: third main surface; 4: first inclined surface; 5: third inclined surface; 6: second inclined surface; 7: outer peripheral surface; 8: fourth main surface; 9: fourth inclined surface; 10: silicon carbide substrate; 11: substrate region (first substrate region); 12: second substrate region; 21: first silicon carbide layer; 22: second silicon carbide layer; 23: third silicon carbide layer; 31: fifth main surface; 32: fifth inclined surface; 100: recycle wafer of silicon carbide; 131: drift region; 132: body region; 133: source region; 134: contact region; 136: oxide film; 137: interlayer insulating film; 138: interconnection layer; 141: gate electrode; 142: source electrode; 143: drain electrode; 300: silicon carbide semiconductor device; P1: position; S1: substrate receiving step; S2: epitaxial growth step; S3: polishing step; S4: mechanical polishing step; S5: chemical mechanical polishing step; T1: first thickness; T2: second thickness; T3: third thickness; T4: fourth thickness; a1: first horizontal length; a2: second horizontal length; a3: third horizontal length; a4: fourth horizontal length; a5: fifth horizontal length; b1: first vertical length; b2: second vertical length; b3: third vertical length; b4: fourth vertical length; b5: fifth vertical length; θ1: first angle; θ2: second angle; θ3: third angle; θ4: fourth angle.

The invention claimed is:

1. A recycle wafer of silicon carbide comprising:
    a silicon carbide substrate having a first main surface and a second main surface opposite to the first main surface; and
    a first silicon carbide layer in contact with the first main surface, wherein
    the silicon carbide substrate includes a substrate region that is within 10 μm from the first main surface toward the second main surface, and
    in a direction perpendicular to the first main surface, a value obtained by subtracting a value that is three times a standard deviation of a nitrogen concentration in the substrate region from an average value of the nitrogen concentration in the substrate region is greater than a minimum value of a nitrogen concentration in the first silicon carbide layer.

2. The recycle wafer of silicon carbide according to claim 1, wherein the minimum value of the nitrogen concentration is greater than a value obtained by dividing the average value of the nitrogen concentration by 1000.

3. The recycle wafer of silicon carbide according to claim 1, wherein
    the silicon carbide substrate further has an outer peripheral surface, a first inclined surface, and a second inclined surface, the first inclined surface being continuous to each of the first main surface and the outer peripheral surface and being inclined toward the second main surface as the first inclined surface extends from the first main surface to the outer peripheral surface, the second inclined surface being continuous to each of the second main surface and the outer peripheral surface and being inclined toward the first main surface as the second inclined surface extends from the second main surface to the outer peripheral surface,
    the first silicon carbide layer is in contact with the first inclined surface,
    the first silicon carbide layer has a third inclined surface opposite to the first inclined surface,
    a length of the third inclined surface in a direction parallel to the first main surface is greater than a length of the second inclined surface in a direction parallel to the second main surface, and
    a length of the third inclined surface in the direction perpendicular to the first main surface is greater than a length of the second inclined surface in a direction perpendicular to the second main surface.

4. The recycle wafer of silicon carbide according to claim 1, further comprising a second silicon carbide layer in contact with the second main surface.

5. The recycle wafer of silicon carbide according to claim 4, wherein a thickness of the second silicon carbide layer is greater than a thickness of the first silicon carbide layer.

6. A method for manufacturing a silicon carbide semiconductor device, the method comprising:
    preparing the recycle wafer of silicon carbide according to claim 1; and
    processing the recycle wafer of silicon carbide.

* * * * *